United States Patent [19]

Cohen et al.

[11] 4,316,951
[45] * Feb. 23, 1982

[54] MULTILAYER PHOTOSENSITIVE ELEMENT WITH SOLVENT-SOLUBLE LAYER

[75] Inventors: Abraham B. Cohen, Springfield; Roxy N. Fan, East Brunswick, both of N.J.

[73] Assignee: E. I. Du Pont de Nemours and Company, Wilmington, Del.

[ * ] Notice: The portion of the term of this patent subsequent to Jan. 27, 1998, has been disclaimed.

[21] Appl. No.: 178,734

[22] Filed: Aug. 18, 1980

Related U.S. Application Data

[63] Continuation-in-part of Ser. No. 747,023, Dec. 2, 1976, abandoned, which is a continuation-in-part of Ser. No. 583,455, Jun. 3, 1975, abandoned.

[51] Int. Cl.$^3$ .................... G03C 11/12; G03C 1/78
[52] U.S. Cl. .................................. 430/253; 430/271; 430/281; 430/273
[58] Field of Search ............... 430/271, 281, 252, 255, 430/273

[56] References Cited

U.S. PATENT DOCUMENTS

| | | | |
|---|---|---|---|
| 3,241,973 | 3/1966 | Thommes | 96/115 |
| 3,359,107 | 12/1967 | Goffe et al. | 96/83 |
| 3,375,112 | 3/1968 | Theodorou | 96/67 |
| 3,754,920 | 8/1973 | Kuchta | 96/87 R |
| 3,793,017 | 2/1974 | Reidis | 96/1 M |
| 3,891,441 | 6/1975 | Tsuji et al. | 96/35.1 |

FOREIGN PATENT DOCUMENTS

7413916 10/1974 Netherlands .

*Primary Examiner*—Jack P. Brammer

[57] ABSTRACT

An improved peel apart photosensitive element for producing duplicate solvent-developed images comprising a strippable cover sheet, a photoadherent layer, a solvent-soluble, nontanable, polymeric nonphotosensitive contiguous layer and a support for photomechanical applications.

18 Claims, 1 Drawing Figure

MULTILAYER PHOTOSENSITIVE ELEMENT WITH SOLVENT-SOLUBLE LAYER

CROSS REFERENCE TO PRIOR APPLICATION

This is a continuation-in-part of application Ser. No. 747,023, filed Dec. 2, 1976 now abandoned which is a continuation-in-part of application Ser. No. 583,455, filed June 3, 1975, now abandoned.

BACKGROUND OF THE INVENTION

1. Field of the Invention

The invention relates to the field of image reproduction with photosensitive elements, particularly those comprising polymeric layers, which are peeled apart in the process of forming images. Such elements are particularly useful for image reproduction and for color proofing and related photomechanical uses, e.g., as lithographic transparencies, photomasks, photoresists, etc.

2. Description of the Prior Art

The prior art describes a variety of photopolymer elements and processes of use, which include producing an image by toning unexposed areas of a photopolymer layer, by image transfer, and producing an image by peeling a photosensitive element apart. In addition, such prior art as U.S. Pat. Nos. 3,469,982 and 3,526,504 describe producing a resist image from an imagewise exposed photopolymerizable or photocrosslinkable layer by washing out the unexposed areas of the layer. The elements of the prior art each have a specific utility and likewise have limitations which limit their usefulness in other applications. For example, in the development of photoresists, incomplete washing out of the unexposed areas of the photoresist layer may result in defective printed circuits due to incomplete plating or etching. An element is needed for photoresists, graphic arts and other applications which can produce a polymeric image in the positive-working mode by complete solvent development and which can produce images of colored polymeric material having a high optical density without interfering with the characteristics of the photosensitive element. The elements of the prior art are also limited in the materials that can be used to provide a proper adhesion relationship, and peel apart elements of the prior art may have pinholes in the image due to improper adhesion. Adhesive values of prior art peel apart elements are typically below 20 g/inch with differences between exposed and unexposed areas being a fraction of this value. Such peel apart elements are characterized in the publication "Image Formation by Photoadhesion" by Woodruff et al., Photographic Science and Engineering, Vol. 11, No. 2, pp. 93–97, March–April 1967. Because of their limited image fidelity such peel part systems are restricted to less demanding uses, e.g., engineering drawings, etc.

SUMMARY OF THE INVENTION

In accordance with this invention improved peel apart photosensitive elements are provided which comprise, in order, from top to bottom (1) a strippable cover sheet, (2) a photoadherent layer coated on cover sheet (1) comprising a material with ethylenically unsaturated or benzophenone type groups, a polymeric binder and a photoinitiating system, (3) a solvent-soluble, nontonable, polymeric, nonphotosensitive contiguous layer, and (4) a sheet support, the exposed areas of said photoadherent layer, after imagewise exposure through the cover sheet (1) of said element to actinic radiation, having greater adhesion to said cover sheet than to said contiguous layer, and are completely removable with said cover sheet and the unexposed areas of said photoadherent layer having greater adhesion to said contiguous layer than to said cover sheet, the areas of the photoadherent layer remaining on the contiguous layer after stripping off the cover sheet must be insoluble under a condition under which the contiguous layer is soluble.

BRIEF DESCRIPTION OF THE DRAWINGS

The FIGURE of the drawing shows a preferred embodiment comprising as a strippable cover sheet 1, a photoadherent layer 2, a contiguous solvent-soluble, nontonable layer 3 and a support 4. the areas 5 of the photoadherent layer adhere to and are completely removed with the cover sheet after imagewise exposure of the element to actinic radiation leaving insoluble areas 6 of the photoadherent layer remaining on the contiguous layer. Areas 5 are the exposed areas of the photoadherent layer and areas 6 are the unexposed areas. The areas 7 of the contiguous layer which are between the insoluble remaining areas of the photoadherent layer are then washed out with a solvent in which the areas 7 are soluble and in which areas 6 are insoluble. Preferably, a duplicate polymeric image is produced.

DESCRIPTION OF THE PREFERRED EMBODIMENT

Figure 1:
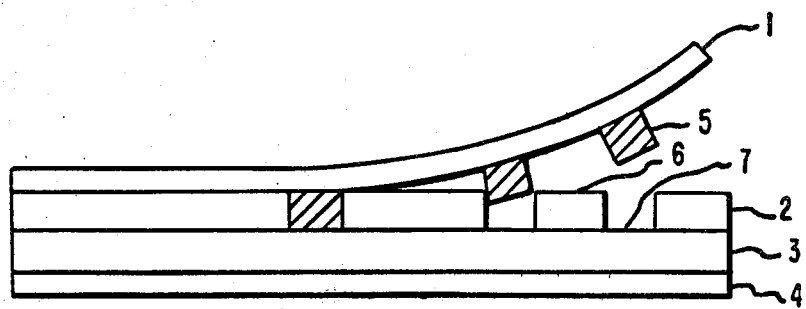

The invention is a versatile photosensitive element capable of producing a variety of image, most preferably, duplicate polymeric images for use as photoresists and, where the image is colored, as photomasks, transparencies, and the like. The photoadherent layer, which is preferably the sole photosensitive layer of the element, is one whose adhesive relationship between the cover sheet and the contiguous layer is altered by exposure to actinic radiation, so that after exposure the exposed areas of the photoadherent layer adhere more strongly to the cover sheet than to the contiguous layer and are removed with the cover sheet leaving the unexposed areas remaining on the contiguous layer. Adhesive and cohesive force relationships of the layers are useful in characterizing the elements of this invention wherein $A_1$ represents the adhesive force between the cover sheet (1) and the unexposed photoadherent layer (2); $A_2$ represents the adhesive force between the unexposed photoadherent layer (2) and the contiguous layer (3); and C represents the cohesive value of the unexposed photoadherent layer (2). Thus in the unexposed state $A_1$ is the lowest value, and the element will peel at the cover sheet/photoadherent layer interface. The force relationship may be represented by:

$$C > A_1 << A_2$$

It has been found that upon imagewise exposure of the element, dramatic changes occur in adhesive and cohesive values. $A_1^*$ represents the adhesive force between exposed areas (5) of the photoadherent layer (2) and the cover sheet (1); $A_2^*$ represents the adhesive force between exposed areas (5) and the contiguous layer (3); and $C^*$ represents the cohesive value of the photoadherent layer in the exposed areas (5). Thus in the exposed state $A_2^*$ is the lowest value while the cohesive value C of the unexposed areas also must be sufficiently low to allow a clean break in the photoadherent layer (2) at the interface between the exposed areas (5) and unexposed areas (6) to allow exposed areas (5) to be completely removed when the cover sheet is peeled away. The resulting force relationship may be represented by:

$$C < A_1^* > > A_2^* < C^*$$

The combined effect of these cohesive and adhesive values is measured by the force required to peel or remove the cover sheet from the surface of an element as a function of the amount of actinic exposure. Typically for elements of this invention peel force in the exposed areas, $A_2^*$, is higher than in the unexposed areas, $A_1$. Surprisingly, these novel elements also show greatly improved image fidelity. Thus in the unexposed state, the peel force to remove the cover sheet is very low and separation occurs at the interface between the cover sheet and the photoadherent layer and is equivalent to adhesive force $A_1$. Upon exposure, following the induction period, photopolymerization or photoadhesion starts and peel force values increase with continued exposure. At intermediate exposures where polymerization of the photoadherent layer is insufficient the separation occurs at intermediate points in the photoadherent layer and does not give a good image. At the correct exposure level, however, the locus of failure shifts to the interface between the exposed photoadherent layer and the contiguous layer. The peel force at this point reaches a plateau and remains substantially constant over an extensive exposure range. Peel forces in the plateau regions are equivalent to adhesive forces $A_2^*$.

The unexposed areas of the photoadherent layer remaining on the contiguous layer after stripping off the cover sheet must be insoluble under a condition under which the contiguous layer is soluble so that the areas of the contiguous layer may be washed out imagewise while the remaining unexposed areas of the photoadherent layer which are insoluble in the solvent prevent the areas of the contiguous layer underneath them from being washed out. The difference in the solubility of the photoadherent layer and the contiguous layer may exist in the element in its original condition or may be induced by an intermediate treatment such as exposure to actinic radiation, treatment with a reagent, heating, etc. depending on the particular materials of the element. For example, after imagewise exposure and stripping off of the cover sheet, the element may be given an overall exposure to actinic radiation thereby hardening the remaining areas of the photoadherent layer while the contiguous layer remains unaffected because it is nonphotosensitive, thereby rendering the remaining areas of the photoadherent layer insoluble. It is only required that under some condition the unexposed areas of the photoadherent layer remaining on the contiguous layer be insoluble in a solvent in which the contiguous layer is soluble.

By "washing out" is meant the removal of material by using a solvent, which may include agitation in a bath of solvent, with the aid of mechanical action such as brushing or spraying. The insoluble property of the remaining unexposed areas of the photoadherent layer and the soluble property of the contiguous layer may be due to their respective degrees of photohardening or degree of polymerization or to their respective degrees of absorptivity, hydrophilicity or reactivity with respect to the solvent.

Various solvents suitable for use are disclosed in the prior art. The particular solvent to be used will depend on the materials of which the photoadherent layer and the contiguous layer are composed and the method of use of the element (e.g., whether it is given an overall additional exposure to actinic radiation after stripping the cover sheet). Such hydrocarbon solvents as 1,1,1-trichloroethane, benzene, toluene, and hexane, for example, are known in the art for washing out areas of polymeric layers for image development. In the case of certain polymers, water and dilute aqueous alkali or acid solutions may be used, depending on the particular materials of the element.

The strippable cover sheet of the element of the invention must be strippable (i.e., removable by peeling it apart) from the rest of the element, carrying with it only exposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the cover sheet, the cover sheet's surface may be modified; for example, the topography may be altered and the polarity increased by a surface treatment such as electrostatic discharge or flame treatment. In the case of a polyethylene terephthalate film having a thickness of 0.0005 inch, an electrostatic discharge treatment of at least 0.025 coul/ft$^2$ and preferably about 0.07 coul/ft$^2$ is suitable. However, increased treatments may be used. Flame treatment of the film also will provide good photoadhesion. An air-propane flame may be used. The cover sheet may additionally undergo auxiliary treatment or bear layers to improve adhesion, strength, and other properties.

While the thickness of the cover sheet may be varied over a wide range, films having a thickness of 0.001 inch or less are particularly preferred. Thin cover sheets produce halftone dots of good roundness with sharp edges. In addition a tonal range of 2%-98% dot resolution (using a halftone screen with 150 lines/inch) and a rapid rate of cover sheet strippability, e.g., up to or greater than 9000 inches/minute (22,860 cm/minute) is obtainable with thin cover films. By "tonal range" is meant the range of sizes of resolvable halftone dots as a percentage of a maximum dot size. In general, a rapid rate of cover sheet stripping produces better image quality. The cover sheet should be thick enough so that electrostatic discharge or flame treatment will not injure it and so that it may be stripped without tearing.

As stated above, the exposed areas of the photoadherent layer adhere more strongly to the cover sheet than to the contiguous layer in the exposed areas and more strongly to the contiguous layer than to the cover sheet in the unexposed areas. Photohardenable materials are preferred for the photoadherent layer. Such materials are usually comprised of a material with ethylenically unsaturated or benzophenone-type groups in which an increase in molecular weight and, consequently, an increase in adherence to the cover sheet are caused by exposure to actinic radiation. The well-known photohardenable materials which are comprised of an ethylenically unsaturated material which is photopolymerizable, photocrosslinkable, photodimerizable or combinations thereof are preferred. Such materials are described, for example, in Chu et al., U.S. Pat. No. 3,649,268. Particularly preferred are photopolymerizable compositions comprised of a macromolecular organic polymer binder and an addition polymerizable ethylenically unsaturated monomer. The binder may be those disclosed in U.S. Pat. Nos. 3,469,982 and 3,984,244 and is preferably a polar material such as an acidic polymer containing at least 1.5 mole percent free acid groups to impart polarity to the polymer. The monomer has at least one and preferably two or more terminal ethylenically unsaturated groups capable of free radical initiated, chain propagated addition polymerization, said monomer preferably having some degree of polarity and being compatible with the binder and with the polar surface of the cover sheet, but substantially nondiffusible in the contiguous layer. The photopolymerizable composition will also contain a free radical generation addition polymerization photoinitiating system (i.e., at least one organic photoinitiator compound) activatable by actinic radiation, e.g., ultraviolet and visible radiation. Among acidic binders which have been found useful, there may be mentioned co(methyl methacrylate/methacrylic acid) and monoethyl ester of poly(methyl vinyl ether/maleic anhydride), each of which may be copolymerized in various proportions. Many other polar polymers and copolymers known in the art will be found useful as a binder in the photopolymerizable layer. Among the ethylenically unsaturated monomers which have been found useful are those disclosed in Plambeck, U.S. Pat. Nos. 2,760,863; Cohen and Schoenthaler, 3,380,831 and Chambers and Woodward, 3,573,918. Also useful are epoxy monomers containing ethylenic unsaturation, e.g., monomers of the type disclosed in U.S. Pat. No. 3,661,576 and British Pat. No. 1,006,587. There may be mentioned as examples dipentaerythritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol monohydroxy pentaacrylate, pentaerythritol triacrylate $\beta$-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. The binder may be varied widely in its ratio with the monomer but in general it should be in the range of 3:1 to 1:3. The monomer should be compatible with, and may be solvent for, and/or have a plasticizing action on the binder. The choice and proportions of monomer and binder are made in accordance with the requirements of selective photoadherence and the property of insolubility in a solvent for the contiguous layer. Usually the photoadherent layer will be clear, but for some applications a colored layer may be desired.

The free-radical generating addition polymerization initiating systems activatable by actinic radiation may be, for example, any of those disclosed in Notley, U.S. Pat. Nos. 2,951,752; Chang and Fan, 3,549,367; Fan, 3,558,322; and Chang, 3,926,643. Other particularly useful initiating systems are disclosed in Cescon et al., U.S. Pat. Nos. 3,615,454; Grubb, 3,647,467; Baum et al., 3,652,275; Chang, 3,661,558; and Strilko, 3,697,280. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. Nos. 2,784,183 and Gurney, 3,644,394. Specific compounds which are particularly useful in the photopolymerizable layers of this invention are 2-(stilbyl-4'')-(naphtho-1', 2':4,5)-1,2,3-triazol-2''-sulfonic acid phenyl ester hereinafter designated as Brightener I and 7-(4'-chloro-6'-diethylamino-1',3',5'-triazine-4'-yl) amino-3-phenyl-coumarin hereinafter designated as Brightener II. These compounds are useful in preparing sharp, bright, multicolor image with clean white backgrounds on toning with colorants as shown in U.S. Pat. No. 3,854,950.

While the coating weight of the photoadherent composition may be carried, it has been found that a preferred range from 20–100 mg/dm$^2$ (providing a dry layer thickness of about 0.00006–0.00033 inch) will give good image quality and tonal range.

The contiguous layer may be chosen from a great number of materials that will be soluble at least after imagewise exposure of the element to radiation that is actinic to the photoadherent layer. The contiguous layer is a nonphotosensitive, nontonable polymeric material which is soluble in conventional solvents. Polymers soluble in aqueous solutions may be used for the contiguous layer where it is desired to use an aqueous solvent for wash out. For an element with good aging stability, suitable materials for the contiguous layer should restrain monomer diffusion from the photoadherent layer into the contiguous layer. Such materials may be selected from resin, polymers in which monomer of the photoadherent layer is substantially nondiffusible, nonadhesive compositions, etc. Although the contiguous layer may contain components found in photosensitive layers, the nonphotosensitive contiguous layer of an element is substantially insensitive to the actinic exposure needed to image the photoadherent layer of the element.

Among preferred materials for contiguous layers that can be washed out according to the invention, are polymeric materials soluble in aqueous solutions, such as polyvinyl alcohol, polyvinyl pyrrolidone, polyvinyl pyrrolidone/vinyl acetate, sodium carboxymethyl cellulose, hydroxy propyl cellulose, polyethylene oxide, and acid or anhydride containing binders such as copolymers of maleic anhydride with styrene, vinyl methyl ether, methyl methacrylate, methacrylic acid, or acrylic acid, etc. Also useful are polymeric materials soluble in hydrocarbon or halogenated hydrocarbon solvents which have a softening temperature above room temperature such as the binders disclosed in U.S. Pat. Nos. 3,469,982 and 3,984,244. In the particular instance where the polymeric material of the contiguous layer and the unexposed photoadherent material are soluble in the same solvent, the unexposed photoadherent material remaining after imagewise exposure and removal of the cover sheet with photoadhered areas thereon may be insolubilized by uniformly exposing to actinic radiation. The contiguous layer may be comprised of the polymer or resin alone or it may contain other additives to improve or modify its properties such as plasticizers, pigments, colorants, fillers, brighteners, etc., provided such additives do not render the contiguous layer tacky. With these materials, a stable adhesion balance between the photoadherent layer, the contiguous layer and a support for the contiguous layer may be achieved for preferred elements useful in making color proofs by the overlay method.

Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch) will be satisfactory. The contiguous layer may also be coated as a dispersion, e.g., an aqueous dispersion with satisfactory results. As illustrated in the drawings, the element has a support (4) for the contiguous layer (3). The support (4) may be any suitable film which has the necessary characteristics for the proper adhesion to layer (3) dependent upon how the element is to be used, i.e., for color proofing, e.g., overlay color proofing or for making photomasks, litho negatives, etc., for photomechanical processes. For color proofing by the overlay method, for example, photographic grade polyethylene terephthalate films which may or may not contain an anchoring layer such as those disclosed in Alles, U.S. Pat. No. 2,779,684 may be used. Similar films which may or may not have a releasable coating, e.g., a silicone coating, may also be used. A thermoplastic layer may also be used which allows support (4) to be easily stripped from layer (3) yet holds layers (3) and (4) together when heat laminated or delaminated.

In the case where a thermoplastic layer is used, the stripping operation leaves the thermoplastic layer attached to the contiguous layer (3). A release film that does not require any special treatment is obviously the most convenient.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat contiguous layer (3) onto a support (4) and then after drying the coated layers, laminating the surfaces of layers (2) and (3) under pressure at room temperature or elevated temperature. Layers (2) and (3) may also be coated simultaneously in order on cover sheet (1) and then a support (4) may be laminated to the outer surface of layer (3). All of these methods are known to those skilled in the art of coating multilayer films.

The element of the invention is capable of producing positive or duplicate images (i.e., corresponding images). Accordingly, with an element of the invention, a polymeric image may be produced by exposing the element, stripping the cover sheet, and washing out with a solvent. The soluble contiguous layer provides a layer in which a high density of colorant may be incorporated if desired without interfering with the photosensitivity or operability of the element and whose composition may be selected to provide good adhesion where the contiguous layer is to be laminated to a separate surface. Alternatively, the photoadherent layer may contain a colorant thus producing a reverse image on the stripped cover sheet and a duplicate image on the contiguous layer.

In using the novel film elements of this invention, the film elements are exposed to image-bearing transparencies, e.g., conventional halftone color separation positives by means of actinic radiation to which the photoadherent layer is most sensitive, e.g., a carbon arc which is rich in ultraviolet radiation. Other radiation sources which may be used include mercury vapor or pulsed xenon lamps and lasers. The exposed elements are then delaminated at room temperature by stripping with a moderate to rapid continuous motion the cover sheet (1) from the element at an angle of generally at least 135° leaving a hardened negative image on the cover sheet and an image of uncovered contiguous layer on the element. The unexposed and insoluble image areas of photoadherent layer (2) remain on contiguous layer (3). The bared areas of the contiguous layer are then washed out with a solvent to give a positive image.

EXAMPLES OF THE INVENTION

The following examples illustrate the invention wherein the percentages are by weight.

EXAMPLE 1

A printed circuit is made on a copper-clad epoxy board in the following manner:

I. Photoadherent Layers: Photopolymerizable Coating Compostion

For the photoadherent layer a coating solution of a photopolymerizable composition is prepared by mixing together the following ingredients:

| | |
|---|---|
| Poly(methyl methacrylate/methacrylic acid) (90/10) (M.W. 60,000) | 14.4 g |
| Poly(methyl methacrylate/methacrylic acid) (98.5/1.5) (M.W. 30,000) | 14.4 g |
| Tetraethylene glycol dimethacrylate | 15.7 g |
| (2-o-Chlorophenyl-4,5-diphenyl imidazolyl) dimer | 1.65 g |
| Brightener I (described above) | 0.40 g |
| Brightener II (described above) | 1.95 g |
| 2,2'-Dihydroxy-4-methoxybenzophenone | 0.15 g |
| Polyethylene oxide (MW ~4,000,000) | 0.38 g |
| 2-Mercaptobenzothiazole | 0.75 g |
| Methyl alcohol | 13.5 g |
| Methylene chloride | 40.0 g |

The solution is coated on polyethylene terephthalate film having a thickness of 0.0005 inch which has been surface treated by electrostatic discharge at 0.07 coul/ft$^2$. The coating weight is about 30 mg/dm$^2$.

II. Contiguous Layer:

A coating composition is prepared by mixing together the following ingredients:

| | |
|---|---|
| Polymethyl methacrylate/ methacrylic acid) (98.5/1.5) (M.W. 30,000) | 37.6 g |
| Polymethylmethacrylate (intrinsic viscosity 1.2) | 12.5 g |
| Pentaerythritol triacrylate | 38.1 g |
| Triethylene glycol diacetate | 5.4 g |
| Tert-butyl anthraquinone | 5.4 g |
| 2,2'-methylene bis(4-ethyl-6-tert-butyl-phenol) | 0.7 g |
| Victoria Pure Blue B.O. (CI 42595) | 0.3 g |
| Lacer Wax (Pentaerythritol ester of fatty acids derived from grape seed oil) | 6.0 g |
| Methylene Choride | 530.0 g |

The resulting solution is coated on a sample of polyethylene terephthalate film having a releasable layer of polydimethyl/siloxane coated thereon to give a coating weight of 230 mg/dm². The coating does not retain toner.

III. Operations for Constructing a Printed Circuit

The contiguous layer surface of element (II) is laminated at 110° C. and a pressure of about 40 pounds per square inch to the surface of a copper clad epoxy board which is conventionally used in the preparation of printed circuits. The copper surface has been degreased and cleaned as is known in the art. The film with the releasable layer is stripped from the contiguous layer which is then laminated in surface to surface contact with the coated layer of element (I) at 104° C. with a pressure of 40 pounds per square inch.

The resulting element is exposed through a positive transparency of the desired printed circuit through the clear film cover sheet contiguous with the photopolymerizable layer. The clear film cover sheet is then stripped off at a moderate rate with a continuous motion. The exposed areas photoadhere completely to the cover sheet leaving unexposed image areas of the desired circuit on the blue-dyed contiguous layer. The uncovered areas of the contiguous layer are developed by wiping with a cotton pad soaked with methyl chloroform to give a light blue circuit image on the copper board. The circuit board is then immersed in a conventional ferric chloride etching solution to remove the unwanted copper layer. The remaining photopolymer layer and underlying contiguous layer are then removed by methylene chloride to give a good quality printed circuit.

This process is useful in arranging the exposure of a transparency in such a manner that the desired conductive pattern may be formed by plating, chemical milling or other methods of modification as taught by Celeste, U.S. Pat. No. 3,469,982.

For example, the etchable metal surface can be magnesium, zinc, copper, alloys of such metals, aluminum, anodized and dyed anodized aluminum, steel alloys, beryllium - copper alloys, etc.

EXAMPLE 2

An element wherein the photoadherent layer contains a colorant is made as follows:

I. Photoadherent Layer: Photopolymerizable Coating Composition

A polyethylene terephthalate photographic grade film, having a thickness of 0.0005 inch aand surface treated by exposure to electrostatic discharge (0.07 coul/ft²) is coated with the following photopolymerizable composition:

| Component | Amount (g) |
| --- | --- |
| (a) Methylene chloride solvent | 780.0 |
| (b) Methanol solvent | 9.9 |
| (c) 2-Ethoxyethanol solvent | 5.0 |
| (d) Terpolymer formed from 56% ethylacrylate, 37% methyl methacrylate and 7% acrylic acid, M.W. ca. 260,000, acid number 76-85 | 10.5 |
| (e) 1:1 Copolymer of styrene and maleic anhydride, partially esterified with isopropyl alcohol, M.W. ca. 1700, acid number ca. 270 | 6.0 |
| (f) Triethylene glycol dimethacrylate | 5.0 |
| (g) Trimethylol propane triacrylate | 0.68 |
| (h) 2,2'-Bis(2-chlorophenyl)-4,4',5,5'-tetraphenyl biimidazole | 3.4 |
| (i) Michler's ketone | 1.8 |
| (j) Colloidal carbon | 7.0 |

In prparing the above coating formulation component (j) is first mixed separately with an equal quantity of component (d) and sand milled to obtain a small particle size. The dry coating weight of the coated formulation is 49.1 mg/dm².

II. Contiguous Layer:

A 1% by weight ethanol solution of hydroxypropyl cellulose (M.W. ca. 1,000,000) is coated onto a 0.0025 inch thick polyethylene terephthalate film and is dried to give a dry coating weight of 10 mg/dm².

III. Lamination Procedure

Elements from I and II are laminated in surface to surface contact of the coated layers at about 85° C. and about 40 pounds per square inch pressure.

IV. Exposure and Delamination

The element is exposed to an image transparency by means of an exposed device identified as a nuArc ® Plate Maker "Flip Top" manufactured by the nuArc Company, Chicago, Ill. Good photoadhesion is obtained and good images are formed on the treated cover sheet which could be used as a negative-working phototool, i.e., visual aid slides, exposure transparencies, and color proofing, etc. The exposed areas of the photoadherent layer adhered to and are removed with the cover sheet when it is stripped.

The bared areas of the contiguous layer can be removed by a suitable solvent, e.g., by gentle rubbing with a pad saturated with water at room temperature, which does not affect the unexposed colored photopolymerizable layer to reproduce the image transparency by a positive working process.

EXAMPLE 3

An element wherein the photoadherent layer contains a colorant is made as in Example 2 except that the contiguous layer is prepared by coating a 20% by weight methylene chloride solution of poly(vinylpyrolidone/vinyl acetate) (60/40) on a 0.0025 inch polyethylene terephthalate film to give a dry coating weight of 93.6 mg/dm² and by laminating elements I and II at room temperature. After imagewise exposure as described in Example 2, good photoadhesion to the cover sheet is obtained to form negative images thereon after removal from the element. The uncovered areas of the contiguous layer are removed by washing with water to give a positive reproduction of the image transparency.

EXAMPLE 4

An aqueous developable element is made as follows:

I. Photoadherent Layer: Photopolymerizable Coating Composition

A polyethylene terephthalate film having a thickness of 0.001 inch and surface treated by exposure to electrostatic discharge (0.07 coul/ft²) is coated with the following photopolymerizable composition:

| | |
|---|---|
| Polymethyl methacrylate (M.W. ~40,000) | 20.0 g |
| Trimethylolpropane trimethacrylate | 15.0 g |
| (2-o-Chlorophenyl-4,5-diphenyl imidazolyl) dimer | 1.0 g |
| Brightener I (described above) | 0.7 g |
| Brightener II (described above) | 0.3 g |
| 2,2'-Dihydroxy-4-methoxybenzophenone | 0.6 g |
| 2-Mercaptobenzothiazole | 0.6 g |
| Polyoxyethylene lauryl ether | 3.0 g |
| Methylene chloride | 800.0 g |

II. Contiguous Layer

A water soluble contiguous layer coating composition is made from the following components:

| | |
|---|---|
| Polyvinyl pyrrolidone (20% solution) | 13.0 g |
| Polyvinyl alcohol (10% solution) | 5.0 g |
| Carbon black (aqueous dispersion containing 15% carbon black and 5% polyvinyl alcohol) | 25.0 g |
| Isooctyl phenyl polyethoxy ethanol | 5.0 ml |
| Water | 40.0 g |

This composition is coated on a polyethylene terephthalate film having a gelatin sublayer.

III. Lamination Procedure

Elements from I and II are laminated in surface to surface contact of the coated layers at 50° C.

IV. Exposure and Delamination

The element is exposed to an image transparency for 30 seconds with a xenon arc. The 0.001 inch thick electrostatic discharge treated polyethylene terephthalate cover sheet is stripped and the exposed areas of the photopolymerizable layer adhere thereto. The element is then given an overall nonimagewise exposure to actinic radiation to harden the remaining areas of the photopolymerizable layer. The bared areas of the black contiguous layer are washed out with cold water, leaving a black image with an optical density of about 3.5. The image bearing element produced is useful as a positive working litho film. Such litho film possess an optical density in the contiguous layer of at least 3.0 and preferably 4.0.

EXAMPLE 5

An aqueous developable element is made as follows:

I. Photoadherent Layer: Photopolymerizable Coating Composition

A polyethylene terephthalate film having a thickness of 0.001 inch and surface treated by exposure to electrostatic discharge (0.07 coul/ft²) is coated with the following photopolymerizable composition:

| Component | Amount (g) |
|---|---|
| Methylene chloride solvent | 1375.0 |
| Methanol solvent | 130.0 |
| Trichloroethylene solvent | 2795.0 |
| Poly(methyl methacrylate/methacrylic acid) (90/10) (MW 30,000–50,000) | 369.0 |
| Poly(ethylene oxide) (MW ca.1,000,000) | 2.5 |
| Tetraethylene glycol dimethacrylate | 141.5 |
| 2,2-Bis-(2-chlorophenyl)-4,4',5,5'-tetraphenyl biimidazole | 14.75 |
| Brightener I (described above) | 3.85 |
| Brightener II (described above) | 17.15 |

-continued

| Component | Amount (g) |
|---|---|
| 2,2'-Dihydroxy-4-methoxybenzophenone | 1.35 |
| 2-Mercaptobenzothiazole | 9.85 |

Contiguous Layer

| Component | Amount (g) |
|---|---|
| Methylene chloride solvent | 2733.0 |
| 2-Ethoxy ethanol solvent | 229.0 |
| 1:1 Copolymer of styrene and maleic anhydride, partially esterified with isopropyl alcohol, MW ca. 1700, acid number ca. 270 | 123.0 |
| Polyethylene oxide | 1.2 |
| Triethylene glycol dimethacrylate | 82.0 |
| Lacer Wax (pentaerythritol of fatty acids derived from grape seed oil) | 144.0 |
| Fluocarbon surfactant FC-430 (a product of 3M Co.) | 0.25 |
| 2,2'-Methylene bis(4-ethyl-6-tert-butyl phenol) | 0.06 |
| Carbon black | 180.0 |

This composition is coated on resin subbed 0.005 inch polyethylene terephthalate film wherein the resin sub is alkali soluble.

III. Laminate Procedure

Elements from I and II are laminated in surface to surface contact of the coated layers at 50° C.

IV. Exposure and Delamination

The element is exposed to an image transparency for 30 seconds with a xenon arc. The 0.001 inch thick electrostatic discharge treated polyethylene terephthalate cover sheet is stripped and the exposed areas of the photopolymerizable layer adhere thereto. The element is then washed with an alkaline sodium carbonate/bicarbonate solution to remove the uncovered areas of the contiguous layer to produce a black positive image of the image transparency.

The foregoing examples represent preferred embodiments of the invention, wherein the exposed areas of the photoadherent layer adhere to and are removed by stripping the cover sheet, the areas of the photoadherent layer which remain on the contiguous layer being insoluble in a solvent in which the contiguous layer is soluble due to the difference in the solubility of the original materials of which these layers are composed. However, the difference in solubility may be affected by an intermediate treatment, e.g., exposure to actinic radiation, in other embodiments. For example, such an exposure of the element, nonimagewise, after stripping the cover sheet could serve to photoharden and thereby insolubilize the remaining areas of the photoadherent layer. As used herein, therefore, a "soluble" contiguous layer includes contiguous layers which are soluble without an intermediate treatment and also those which are soluble with an intermediate treatment. Likewise, "insoluble" denotes materials which are insoluble or capable of being rendered insoluble. The terms, of course, have reference to the same solvent. In preferred embodiments, no intermediate treatment is required, the difference in solubility existing at least immediately after stripping the cover sheet.

As exemplified, the elements of the invention may be used to form a resist image on a surface by laminating the contiguous layer to the surface. Where there is a sheet support on the contiguous layer, it is removed before laminating. Then the cover sheet is stripped off and areas of the contiguous layer are washed out, leaving a polymeric resist image on the surface. It is desirable that the resist image be easily visible, and a colorant may be therefore contained in the contiguous layer. Since the contiguous layer is not photosensitive, the colorant need not be of any particular type for this purpose.

The resist image may be used in a process of permanently modifying the adjacent areas on the surface which are unprotected by the resist image by using a reagent capable of etching said adjacent areas or depositing a material on (e.g., plating) said adjacent areas. In such a case, wash out of the contiguous layer simultaneously with or in the same medium used for surface modification (e.g., an etching bath) is within the scope of the invention.

We claim:

1. A peel apart photosensitive element comprising, in order, from top to bottom (1) a strippable cover sheet, (2) a photoadherent layer coated on cover sheet (1) comprising a material with ethylenically unsaturated or benzophenone type groups, a polymeric binder and a photoinitiating system, (3) a solvent-soluble, nontonable, polymeric, nonphotosensitive contiguous layer, and (4) a sheet support, the unexposed element having the following force relationship: $C > A_1 << A_2$ wherein C represents the cohesive value of the unexposed photoadherent layer (2); $A_1$ represents the adhesive force between cover sheet (1) and unexposed photoadherent layer (2); and $A_2$ represents the adhesive force between unexposed photoadherent layer (2) and contiguous layer (3); the exposed areas (5) of said photoadherent layer, after imagewise exposure through the cover sheet (1) of said element to actinic radiation, having greater adhesion to said cover sheet than to said contiguous layer, and are completely removable with said cover sheet and the unexposed areas (6) of said photoadherent layer having greater adhesion to said contiguous layer than to said cover sheet, the exposed element having the following force relationship: $C < A_1^* >> A_2^* < C^*$ wherein C is as defined above; $A_1^*$ represents the adhesive force between exposed areas (5) of photoadherent layer (2) and cover sheet (1); $A_2^*$ represents the adhesive force between exposed areas (5) and contiguous layer (3); and $C^*$ represents the cohesive value of the photoadherent layer in the exposed areas (5); the areas of the photoadherent layer remaining on the contiguous layer after stripping off the cover sheet must be insoluble under a condition under which the contiguous layer is soluble.

2. An element according to claim 1 wherein said contiguous layer contains an added colorant.

3. An element according to claim 1 wherein said strippable cover sheet is an electrostatic discharge or flame surface treated polymeric film which is transparent to actinic radiation.

4. An element according to claim 3 wherein said strippable cover sheet is a polyethylene terephthalate film.

5. An element according to claim 1 wherein said contiguous layer is comprised of a polymeric material that is soluble in an aqueous solution.

6. An element according to claim 1 wherein said photoadherent layer contains an added colorant.

7. An element according to claim 2 wherein said colored contiguous layer has an optical density of at least 3.0.

8. An element according to claim 1 containing an auxiliary layer interposed between the contiguous layer (3) and the sheet support (4).

9. An element according to claim 8 wherein the auxiliary layer is a release layer.

10. An element according to claim 8 wherein the auxiliary layer is an anchoring layer.

11. An element according to claim 8 wherein the auxiliary layer is thermoplastic.

12. An element according to claim 1 wherein the sheet support (4) has a metal surface in contact with the surface of said contiguous layer.

13. An element according to claim 12 wherein the metal surface is copper.

14. An element according to claim 1 wherein the sheet support (4) is transparent.

15. An element according to claim 1 wherein the sheet support (4) is a polymeric film.

16. An element according to claim 15 wherein the polymeric film is polyethylene terephthalate.

17. An element according to claim 1 wherein the sheet support (4) contains an added colorant.

18. An element according to claim 17 wherein the colored sheet support has an optical density of at least 3 over a portion of the visible or actinic spectrum.

* * * * *